(12) United States Patent
Mehr

(10) Patent No.: US 7,091,792 B2
(45) Date of Patent: Aug. 15, 2006

(54) METHODS AND APPARATUS FOR AMPLIFICATION IN A TUNER

(75) Inventor: Iuri Mehr, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 58 days.

(21) Appl. No.: 10/849,738

(22) Filed: May 20, 2004

(65) Prior Publication Data

US 2005/0258904 A1    Nov. 24, 2005

(51) Int. Cl.
*H03F 3/04* (2006.01)

(52) U.S. Cl. .................................. 330/305; 330/124 R

(58) Field of Classification Search .............. 330/305, 330/124 R, 295, 51, 279, 254
See application file for complete search history.

(56) References Cited

U.S. PATENT DOCUMENTS

| | | | |
|---|---|---|---|
| 4,833,400 A * | 5/1989 | Boutigny | 324/126 |
| 4,887,045 A * | 12/1989 | Nakayama | 330/69 |
| 5,077,541 A | 12/1991 | Gilbert | |
| 5,737,035 A | 4/1998 | Rotzoll | |
| 5,793,253 A * | 8/1998 | Kumar et al. | 330/124 R |
| 6,016,170 A | 1/2000 | Takayama et al. | |
| 6,100,761 A | 8/2000 | Ezell | |
| 6,124,758 A * | 9/2000 | Korte et al. | 330/124 R |
| 6,177,964 B1 | 1/2001 | Birleson et al. | |
| 6,288,606 B1 * | 9/2001 | Ekman et al. | 330/51 |
| 6,377,315 B1 | 4/2002 | Carr et al. | |
| 6,400,416 B1 | 6/2002 | Tomasz | |
| 6,653,898 B1 * | 11/2003 | Monroe | 330/51 |

\* cited by examiner

Primary Examiner—Henry Choe
(74) Attorney, Agent, or Firm—Wolf, Greenfield & Sacks, P.C.

(57) ABSTRACT

Methods and apparatus for amplifying a tuner input signal are disclosed. One embodiment of the invention is directed to a tuner amplifier system comprising a tuner amplifier input that receives a tuner amplifier input signal and a first amplifier comprising an input and an output. The input of the first amplifier is coupled to the tuner amplifier input. The system further comprises a second amplifier comprising an input and an output, the input of the second amplifier being coupled to the tuner amplifier input, and a switch adapted to couple one of the first amplifier output and the second amplifier output to an output of the tuner amplifier. Another embodiment of the invention is directed to a method of amplifying a tuner input signal. The method comprises acts of detecting a power of the tuner input signal, selecting a tuner amplifier to amplify the tuner input signal based on the power of the tuner input signal, and amplifying the tuner input signal using the selected amplifier.

27 Claims, 11 Drawing Sheets

US 7,091,792 B2

METHODS AND APPARATUS FOR AMPLIFICATION IN A TUNER

FIELD OF THE INVENTION

The present invention is directed generally to the field of tuners, and more particularly to tuners implemented in silicon.

DESCRIPTION OF THE RELATED ART

Television signals are transmitted in many different forms. For example, different regions of the world use different transmission standards, which dictate the parameters of transmitted television signals. In addition, television signals may be transmitted through cables that connect to a television or associated set-top box, or alternatively may be transmitted through the air and received using an antenna or satellite dish. In each case, the transmitted signals may be encoded in analog and/or digital format. The encoded signals may then be modulated into a channel using digital or analog modulation, although some forms of information (e.g., data) may only be modulated using one form of modulation (e.g., digital). In both cases, a bandwidth of 6–8 MHz defines a channel. During transmission of the signal, the channel is placed in a frequency range between 43 MHz and 1 GHz.

Each of the television signals described above has different attributes. For example, the width of the channel may vary depending on its transmission standard and whether the signal is modulated using digital or analog modulation, and the power of the television signals may differ depending on whether the signal is transmitted using a cable or terrestrial broadcast and whether the signal is modulated using digital or analog modulation. Thus, each type of television signal dictates a different set of tuner specifications. As a result, a television or set-top box must be provided with a separate tuner for each different type of television signal it is equipped to receive. Providing multiple tuners in a television or set-top box is space and cost intensive.

In view of the foregoing, one object of the invention is directed to a tuner adapted to receive and process different types of television signals, such as analog modulated cable signals, digitally modulated cable signals, analog modulated over-the-air (or "terrestrial") signals, digitally modulated terrestrial signals and/or signals having different transmission standards.

SUMMARY OF THE INVENTION

One embodiment of the invention is directed to a tuner amplifier system. The system comprises a tuner amplifier input that receives a tuner amplifier input signal and a first amplifier comprising an input and an output. The input of the first amplifier is coupled to the tuner amplifier input. The system further comprises a second amplifier comprising an input and an output, the input of the second amplifier being coupled to the tuner amplifier input, and a switch adapted to couple one of the first amplifier output and the second amplifier output to an output of the tuner amplifier.

Another embodiment of the invention is directed to a method of amplifying a tuner input signal. The method comprises acts of detecting a power of the tuner input signal, selecting a tuner amplifier to amplify the tuner input signal based on the power of the tuner input signal, and amplifying the tuner input signal using the selected amplifier.

A further embodiment of the invention is directed to a tuner amplifier system comprising a tuner amplifier input that receives a tuner amplifier input signal and a tuner amplifier output that transmits a tuner amplifier output signal. The system further comprises a first amplifier comprising an input and an output, the input of the first amplifier being coupled to the amplifier input, and a second amplifier comprising an input and an output, the input of the second amplifier being coupled to the amplifier input. The tuner amplifier output signal comprises one of a signal from the first amplifier and a signal from the second amplifier at a given time.

DETAILED DESCRIPTION OF THE INVENTION

A television tuner is a device that receives a television signal from a cable or terrestrial source and outputs a channel of interest, rejecting all other channels. For example, the television tuner may receive a plurality of channels having a signal frequency between 43 MHz and 1 GHz. The tuner may output a single such channel having a bandwidth between approximately 6 MHz and 8 MHz.

Figure 1A:
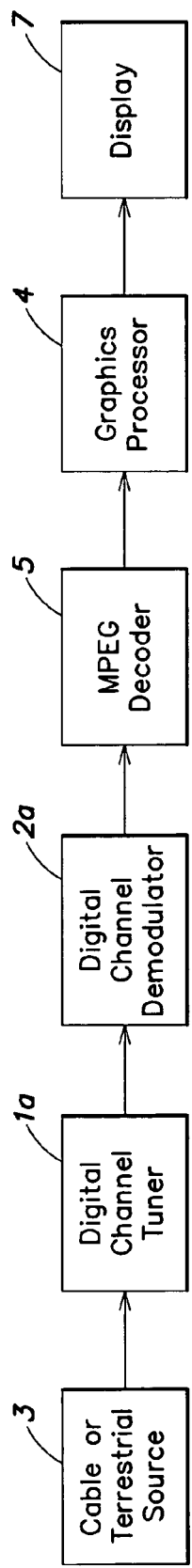
FIGS. 1A and 1B are block diagrams of conventional television apparatus.
Figure 1B:
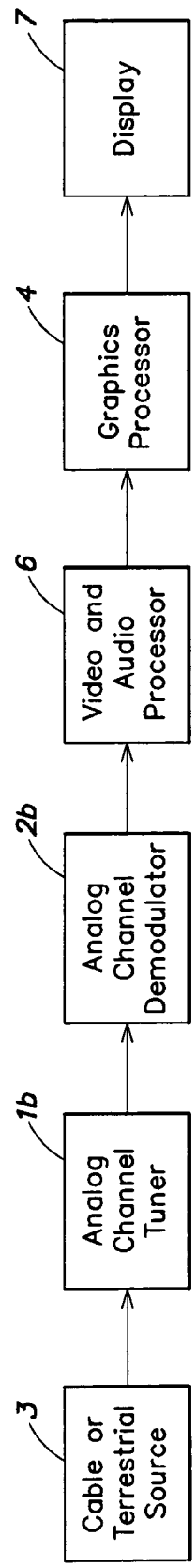

Conventional tuners are adapted to receive either digitally modulated or analog modulated signals. FIGS. 1A and 1B illustrate examples of a digital tuner and an analog tuner, respectively, in the context of conventional television apparatuses. As shown in FIG. 1A, a digital channel tuner 1a receives digitally modulated television signals from a cable or terrestrial source 3. The digital channel tuner 1a outputs a channel of interest, which is demodulated by digital channel demodulator 2a and decoded by an MPEG decoder 5. Next, a graphics processor 4 processes the graphics of the channel for display. Finally, a display 7, such as a plasma display, liquid crystal display, digital light projection display or cathode ray tube, displays the decoded channel of interest. In FIG. 1B, an analog channel tuner 1b receives analog modulated television signals from a cable or terrestrial source 3. The analog channel tuner 1b outputs a channel of interest, which is demodulated by analog channel demodulator 2b and decoded by a video and audio processor 6. Next, a graphics processor 4 processes the graphics of the channel for display. Finally, as in FIG. 1A, a display 7 displays the decoded channel of interest. Conventional television apparatus adapted to receive both analog modulated and digitally modulated signals typically require both the digital channel tuner 1a of FIG. 1B and the analog channel tuner 1b of FIG. 1B.

Tuning to a particular channel involves translating signals in frequency using a mixer. As a result, tuners can have the undesired effect of translating both a channel of interest and an unwanted image channel. For example, if a channel of interest is translated to an intermediate frequency IF, an image channel will be also translated to the same intermediate frequency. The image channel interferes with the channel of interest, and must be eliminated to a large degree for proper reception. To eliminate the image channel, tuners may use filters and/or image-reject mixers. The degree to which the image channel is rejected is called "image rejection."

In single conversion tuners, a tracking bandpass filter is used to reject the image channel prior to frequency translation. However, such filters have drawbacks. For example, a tracking bandpass filter requires discrete components with a high quality factor. In addition, because the filter is associated with a high loss, the amplifier following the filter must have a low noise figure. An alternative is a dual conversion architecture. In dual conversion tuners, a signal is upconverted to a first high intermediate frequency (IF), having a typical center frequency in the range of 1 GHz to 2 GHz. The image signal generated during this upconversion is not troublesome as the image signal is outside of the television frequency band. The image signal for the downconversion operation is largely attenuated compared to the signal of interest using filtering at the intermediate frequency. The signal is then downconverted to a second low IF, having a typical center frequency in the range of 36 MHz to 58.75 MHz, and is further filtered to isolate the channel of interest. Filtering at the low IF is typically performed using surface acoustic wave (SAW) filters.

Conventional single and dual conversion tuners have a number of limitations. For example, the SAW filters that are used to isolate the channel of interest at the low IF are cumbersome to implement. In addition, these SAW filters are specialized for use with television signals having particular attributes such as a given channel bandwidth. Thus, tuners that use SAW filters to isolate the channel of interest at the low IF typically cannot be used with television signals of different standards and types. As a result, multiple tuners or multiple SAW filters are needed to receive television signals of different standards and types.

One aspect of the present invention is directed to a tuner that is adapted to process both analog modulated signals and digital modulated signals. Another aspect of the invention is directed to a tuner that is adapted to process both cable signals and terrestrial signals. A further aspect of the invention is directed to a tuner that is adapted to process signals conforming to different standards. Thus, the tuner may have improved flexibility relative to conventional tuners. Another aspect of the invention is directed to a television tuner that may be implemented in silicon. Thus, the tuner may have reduced cost and/or improved performance. Although these aspects of the present invention may be advantageously employed together, the present invention is not limited in this respect, as each of these aspects of the present invention can also be employed separately or in any combination.

According to one embodiment of the invention, the tuner may have a dual conversion architecture, but may perform low IF filtering on digital signals rather than analog signals. In particular, an analog to digital converter may be used to convert the analog signals to digital signals after downconversion of the signals to the low IF. According to one exemplary implementation, the analog to digital converter may be a sigma delta converter, which provides dynamic range and inherent anti-aliasing, and the mixer that downconverts the signals to the low IF may be a quadrature mixer that generates quadrature signals. Filtering in the digital domain eliminates the need for a SAW filter at the low IF, and therefore may reduce the cost of the tuner. In addition, filtering in the digital domain allows the filtering parameters to be selected based on an aspect of a signal (e.g., the television signal standard), for example by programming the coefficients of a digital filter.

According to another embodiment of the invention, the gain of a broadband signal input to a tuner may be controlled based on an aspect such as power of the broadband signal. Thus, the gain of the signal may be controlled based on the power of the entire input signal, including unwanted channels, so that a proper gain may be selected. To control the gain, a control loop having a programmable automatic gain controller may be included around the front end amplifier of the tuner. Controlling the gain of the signal based on an aspect of the signal allows the gain of the signal to be adjusted in accordance with particular tuner applications, such as terrestrial or cable reception.

According to a further embodiment of the invention, the tuner may be implemented in a single package or module, such as a multi-chip module, which may include a single substrate. The package or module may include a first die for analog processing and a second die for digital processing. Advantageously, the package or module may be a single unit that has the appearance of a single chip.

Figure 2:
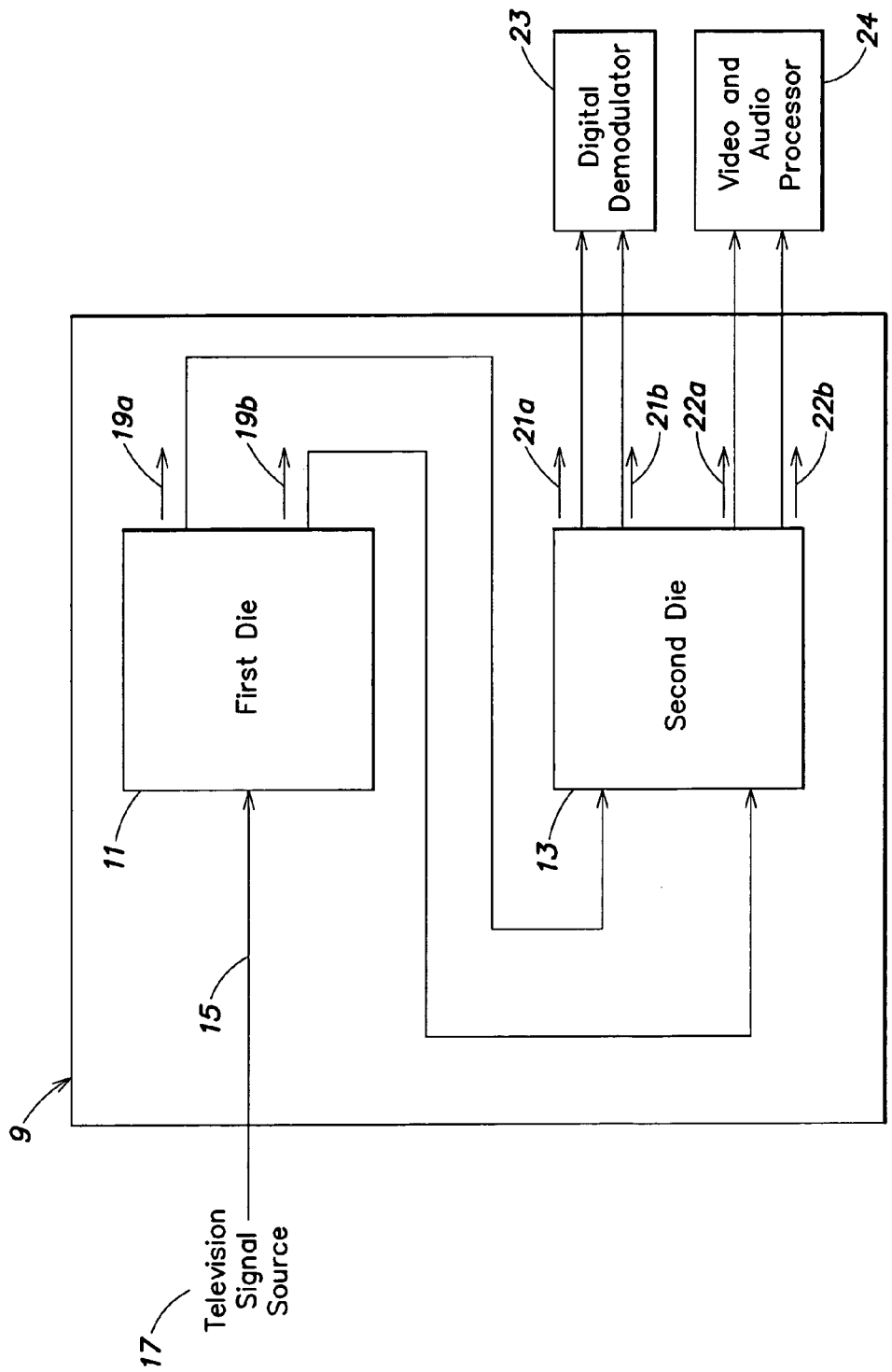
FIG. 2 is a schematic representation of a tuner in accordance with one embodiment of the invention.

FIG. 2 illustrates an embodiment of the invention in which a silicon-implemented tuner 9 comprises a first die 11, which includes circuitry that performs analog processing, and a second die 13, which includes circuitry that performs digital processing. The silicon-implemented tuner 9 may be implemented as a single package or module that includes the first die 11 and second die 13. For example, the tuner 9 may be implemented as a multi-chip module in which the first and second dies 11, 13 are assembled on a single substrate.

The first die receives a television signal 15 from a television signal source 17, which may be a terrestrial receiver (e.g., a television antenna or satellite dish) or a cable. The signals received from the cable or terrestrial source may be digitally modulated or analog modulated television signals. The analog modulated television signals may be encoded in standard NTSC (National Television System Committee) form, which is the transmission standard used in the United States and Canada. Alternatively, the signals may be encoded using the PAL (Phase Alternating Line) transmission standard used in Western Europe and Australia, the SECAM (Sequential Couleur Avec Memoire or Sequential Colour with Memory) transmission standard used in Eastern Europe and France, or another transmission standard. The digitally modulated television signals may be compressed in accordance with MPEG and Dolby standards and transmitted using VSB (Vestigial Sideband Modulation)/QAM (Quadrature Amplitude Modulation), e.g. in the United States, or OFDM (Orthogonal Frequency Division Multiplexing), e.g., in Japan and Europe.

It should be appreciated that although tuner 9 is described herein as receiving and processing television signals, the invention is not limited in this respect. The tuner 9 may be used to receive radio signals or information signals for which frequency tuning is required. Further, the tuner 9 may receive audio, video and/or information signals that are displayed or processed by a device other than a television, such as a personal computer.

The television signal 15 is processed by the analog circuitry of the first die 11 and conveyed to the second die 13 as a pair of quadrature signals 19*a–b*. The second die 13 digitally processes the quadrature signals 19*a–b* and outputs a channel of interest as a pair of signals 21*a–b*, which may be an I/Q quadrature signal. Signals 21*a–b* may then be transmitted to an digital channel demodulator 23 for demodulating the digital channel. In addition, the second die 13 may output signals 22*a–b*, which correspond to an audio and video signal, respectively. Signals 22*a–b* may then be transferred to a video and audio processor 24.

The first and second dies 11, 13 may use silicon technology suitable for analog and digital processing, respectively. For example, the first die 11, which includes circuitry that performs analog processing, may use bipolar or bipolar complementary metal oxide semiconductor (BiCMOS) technology. The second die 13, which includes circuitry that performs digital processing, may use complementary metal oxide semiconductor (CMOS) technology. In addition, the first and second dies 11, 13 may be insulated from each other to reduce noise coupling.

Figure 3:
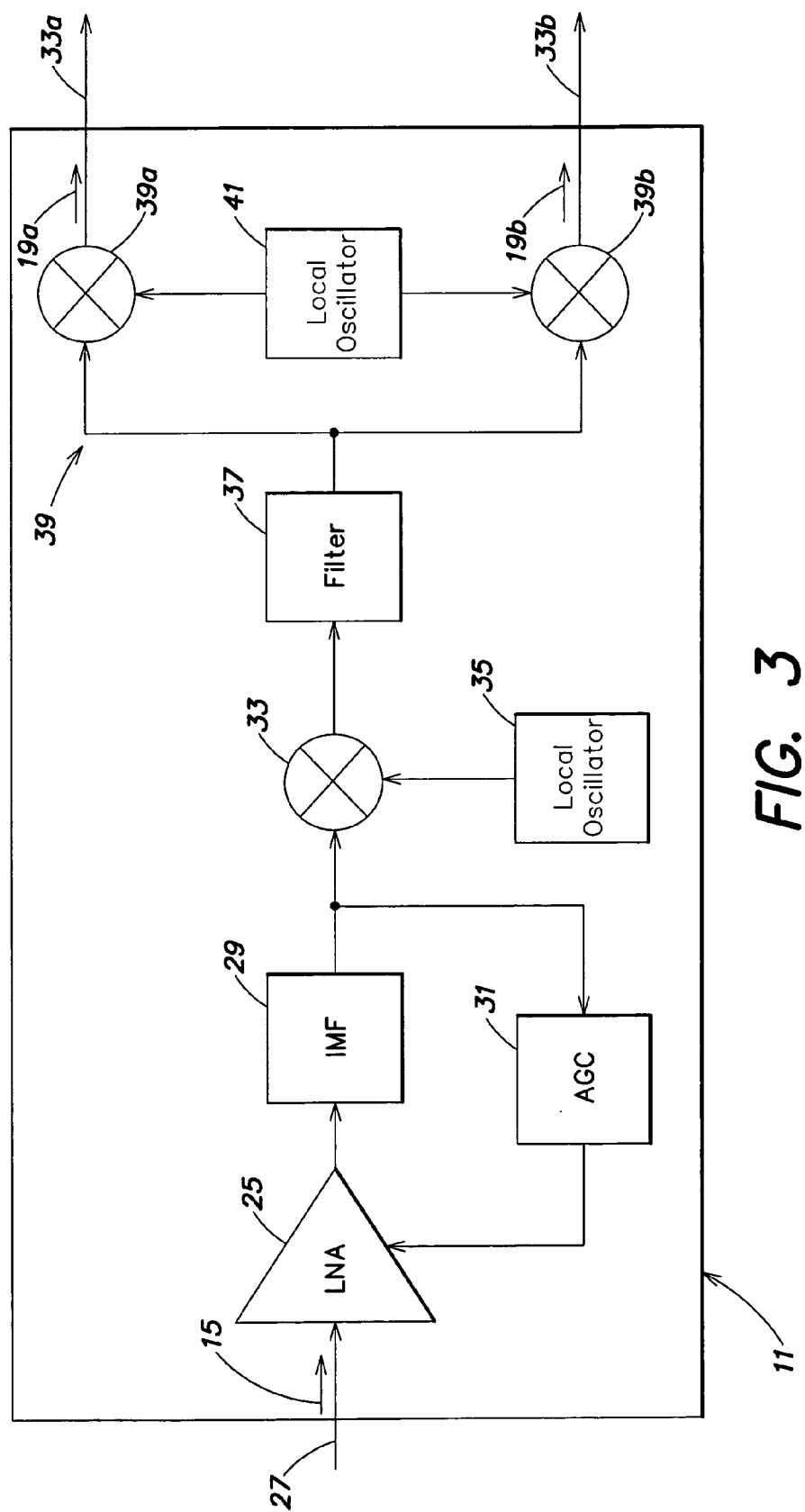
FIG. 3 is a schematic representation of an exemplary implementation of the first die shown in FIG. 2.

FIG. 3 illustrates an exemplary implementation of the first die 11 of FIG. 2. As shown, the first die 11 includes circuitry that performs gain adjustment, upconversion to a first intermediate frequency, and initial filtering of the television signal 15. The circuitry then performs downconversion of the filtered signal to a second intermediate frequency and converts the signal to quadrature signals 19*a–b*. However, it should be appreciated that it is not necessary that all of these function be performed on the first die 11. For example, some or all of the filtering of the television signal 15 may be performed external to first die 11.

The gain adjustment of the television signal 15 is performed by low noise amplifier (LNA) 25, which receives the television signal 15 at an input 27 of the first die 11. LNA 25 may have a variable gain according to one exemplary implementation. An image filter (IMF) 29 receives the output of LNA 25, and filters the output signal to reduce the noise contribution of the LNA 25. The television signal at the output of the LNA 25 may have a decreased or increased amplitude relative to the signal at the input of the LNA 25. According to one embodiment of the invention, the gain of the LNA 25 may be adjusted based on a factor such as a power of the television signal. For example, the gain of the LNA 25 may be adjusted based on the root mean square (RMS) power or the peak power of a broadband television signal. Thus, the composite power of the entire television frequency band (e.g., 43 MHz to 1 GHz) may be measured, rather than merely the power of the desired channel as in conventional implementations of such gain control loops. In the exemplary implementation of FIG. 3, gain control signals are provided by automatic gain controller (AGC) 31 to the LNA 25 based on a detected average power of the full television signal detected at the output of the IMF 29. Exemplary implementations of LNA 25, AGC 31, and IMF 29 will be discussed in detail in connection with FIGS. 6–11.

The output of the IMF 29 is upconverted to a first intermediate frequency by a mixer 33 coupled to a local oscillator 35. In one example, the signal is upconverted to an intermediate frequency of approximately 1.9 GHz. The output of mixer 33 is then processed by a filter 37 that eliminates most of the channels other than the channel of interest. For example, the output of the filter 37 may consist of two to four unattenuated channels adjacent to the desired channel, according to one implementation. Local oscillator 35 may be a fractional phase locked loop frequency synthesizer in one example, such as part number ADF4252 manufactured by Analog Devices, One Technology Way, Norwood, Mass. 02062. Filter 37 may be a band-pass filter having a high quality factor so as not to attenuate the channel of interest. According to one implementation, the filter 37 is a SAW filter with a bandwidth of approximately 20 MHz and image rejection of approximately 40 dB. To achieve the desired image rejection, additional image rejection may be performed at another portion of tuner 9. It should be appreciated that while filter 37 is shown as being included on the first die 11, filter 37 may alternatively be implemented, at least in part, externally to the first die 11. Filter 37 is followed by a quadrature mixer 39, which converts the output of the filter 37 into quadrature signals 19*a–b* having a second intermediate frequency. In particular, mixers 39*a* and 39*b* are coupled to a local oscillator 41 that may be fixed at a frequency lower than that of local oscillator 35 to downconvert the output of the filter 37. Mixer 39*a* is driven by the in-phase (I) component of the local oscillator 41 signal, while mixer 39*b* is driven by the quadrature component (Q) of the local oscillator 41 signal. Downconverted quadrature signals 19*a–b* are output from the first die 11 via outputs 33*a–b* and may comprise a single-ended or differential quadrature representation of the desired channel. According to one implementation, the dynamic range of the quadrature mixer 39 may be approximately the same as the dynamic range of the mixer 33, so that a similar input may be accommodated. The local oscillator 41 may be a fractional phase locked loop frequency synthesizer such as part number ADF4252 or an integer phase locked loop frequency synthesizer such as part number ADF4112 manufactured by Analog Devices, One Technology Way, Norwood, Mass. 02062. According to one implementation, the local oscillator 41 has a frequency between approximately 1.8 GHz and approximately 2.0 GHz, although other frequencies are possible. According to one embodiment, the frequency of the local oscillator 41 may be selected or programmed based on the transmission standard of the television signal 15, as different transmission standards use different intermediate frequencies. Alternatively, the frequency of local oscillator 41 may be fixed.

Each of local oscillators 35 and 41 may have a frequency step size greater than that of conventional frequency synthesizers. For example, the step size of local oscillators 35 and 41 may be greater than 62.5 KHz. For example, local oscillator 35 may have a step size of approximately 1 MHz and local oscillator 41 may have a step size of approximately 500 kHz. The resolution requirement for local oscillators 35 and 41 may be relaxed as a result of digital processing performed on second die 13. Such digital processing may translate the signal of interest to a desired frequency with sufficient resolution so that the step size of local oscillators 35 and 41 may be increased.

Figure 4:
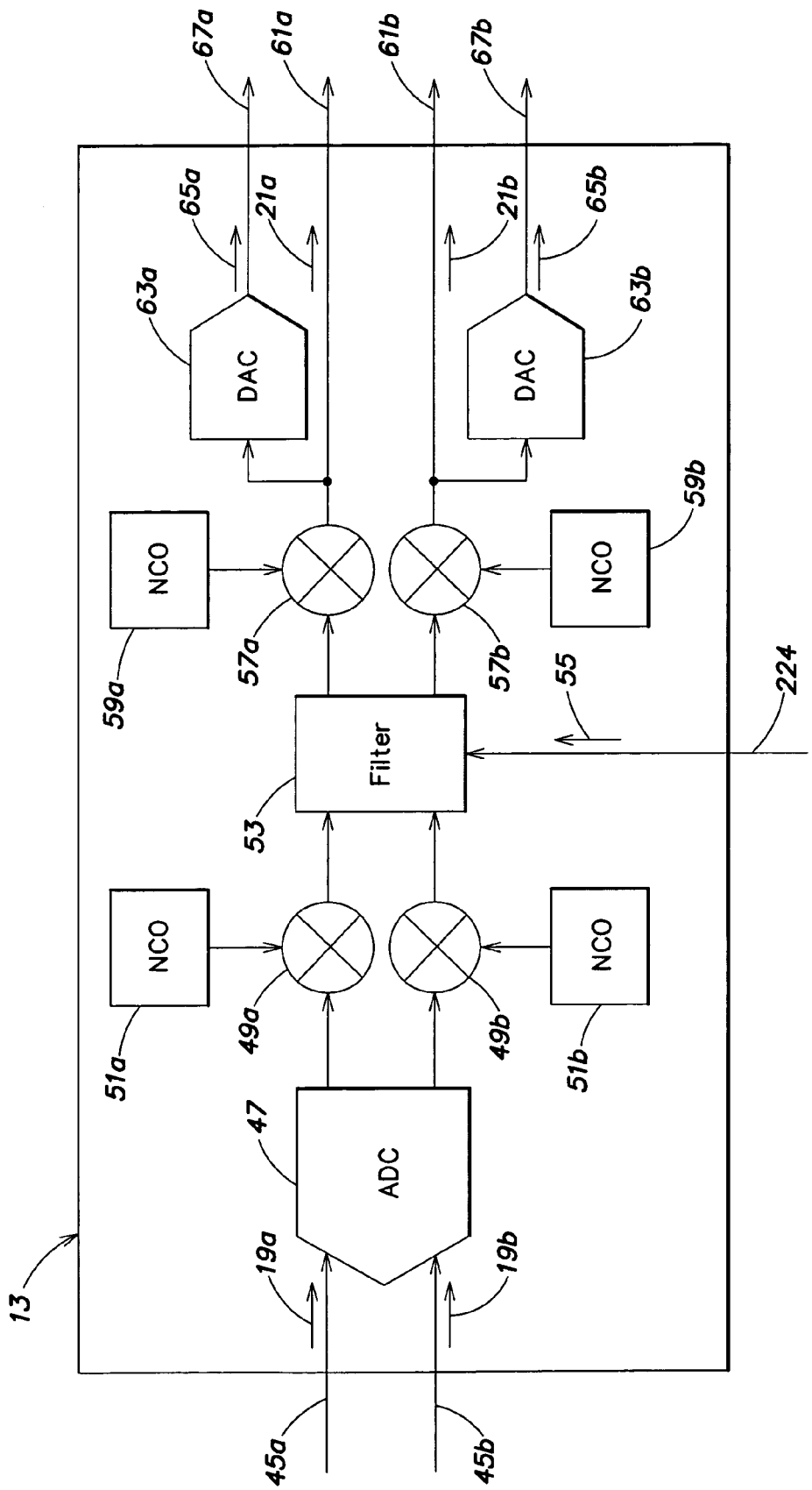
FIG. 4 is a schematic representation of an exemplary implementation of the second die shown in FIG. 2.

FIG. 4 illustrates an exemplary implementation of the second die 13 of FIG. 2. The die may include circuitry that performs analog-to-digital conversion of quadrature signals 19*a–b*, frequency translation of the signals to baseband, and additional filtering. The quadrature signals 19*a–b* output by the outputs 33*a–b* of the first die 11 are input to inputs 45*a–b* of the second die 13. According to one aspect of the invention, quadrature signals 19a–b may be current signals. The current signals may be differential current signals, according to one example, and may be generated by quadrature mixer 39. The current signals may be transmitted directly to the second die 13 of tuner 9. In particular, quadrature signals 19a–b may be transmitted directly to an analog-to-digital converter (ADC) 47 of the second die 13.

The ADC 47 may convert the analog quadrature signals into digital quadrature signals that are subjected to filtering and decimation. For example, the output of the ADC 47 may be decimated by a factor of eight or sixteen. In addition, some of the channels adjacent to the channel of interest that are not eliminated by filter 37 (FIG. 3) may be attenuated by digital filtering following the ADC 47. In one example, the ADC 47 is a sigma delta converter. A sigma delta converter samples an analog input at many times the Nyquist rate and produces a one or multi-bit output that tracks the analog input in the frequency range of interest. This output is processed by a digital filter to produce a high resolution conversion result. The sigma delta converter may be implemented in a continuous-time fashion, which provides for an anti-aliasing function. Due to the high dynamic range and inherent anti-aliasing function of the ADC 47 implemented as a sigma delta converter, it is not necessary to perform filtering at the second intermediate frequency as in conventional tuners. This results in a tuner having a reduced cost.

The output of ADC 47 is translated to baseband, which may be at or near DC (0 Hz), by a quadrature mixer 49a–b coupled to numerically controlled oscillators (NCO) 51a–b. NCOs 51a–b enable the output of the ADC 47 to be translated to baseband with sufficient resolution such that the resolution of local oscillators 35 and 41 may be relaxed, as described previously. According to one exemplary implementation, NCOs 51a–b have a step size of approximately 62.5 KHz or less. The output of the mixer 49 is then filtered by a filter 53, which further isolates the channel of interest. One advantage of filtering at baseband is that it is less expensive than filtering at other frequencies.

According to one embodiment of the invention, the filter 53 may be programmable to accommodate different types of signals, such as digitally modulated cable signals, digitally modulated terrestrial signals, analog modulated cable signals, or analog modulated terrestrial signals. In addition, the filter 53 may be programmable to accommodate television signals adhering to different standards in use around the world, such as NTSC in the United States and Canada, PAL in Western Europe and Australia, and SECAM in Eastern Europe and France. Thus, the filter 53 may be a Nyquist filter. It should be appreciated that the foregoing examples are merely exemplary, and that the filter 53 may be programmed to accommodate television signals adhering to other standards, such as those recognized by the International Telecommunication Union (ITU). One parameter of the filter 53 that may be modified is the bandwidth of the filter. For example, to program the filter 53 to accommodate a digital cable television signal in the United States, the bandwidth may be set at 6 MHz. To program the filter 53 to accommodate a digital terrestrial television signal in Australia, the bandwidth may be set at 7 MHz. Another parameter of the filter 53 that may be modified is frequency characteristics of the filter.

The filter 53 may be programmed with filter coefficients corresponding to a particular signal type and standard, and reprogrammed to accommodate different signal types and standards. According to one example, programming may be performed using a set top box controller or a television controller that transmits control signal 55 to the filter 53. The control signal 55 may be transmitted to the filter 53 via input 224, which may for example be coupled to a serial port interface.

According to another example, the modulation type of the television signal (e.g., analog or digital) may be detected at filter 53, and the filter coefficients may be programmed or adapted based on the detected modulation type. Two exemplary ways of detecting the modulation type of a television signal are attempting to detect a carrier signal in the frequency domain, and attempting to detect a sync signal in the time domain. By detecting the presence of an analog signal based on one of these characteristics, it is possible to distinguish analog modulation from digital modulation. Referring to the first example, if a carrier signal is detected in the television signal, it may be concluded that the signal is modulated using analog modulation. If a carrier signal is not detected, it may be concluded that the signal is digitally modulated. Referring to the second example, if a sync signal is detected in the television signal, it may be concluded that the signal is modulated using analog modulation. If a sync signal is not detected, it may be concluded that the signal is digitally modulated. Filter 53 may be adaptive, such that its filter coefficients may be set or changed automatically (e.g., without user intervention) in response to the detection of analog or digital modulation.

Figure 5:
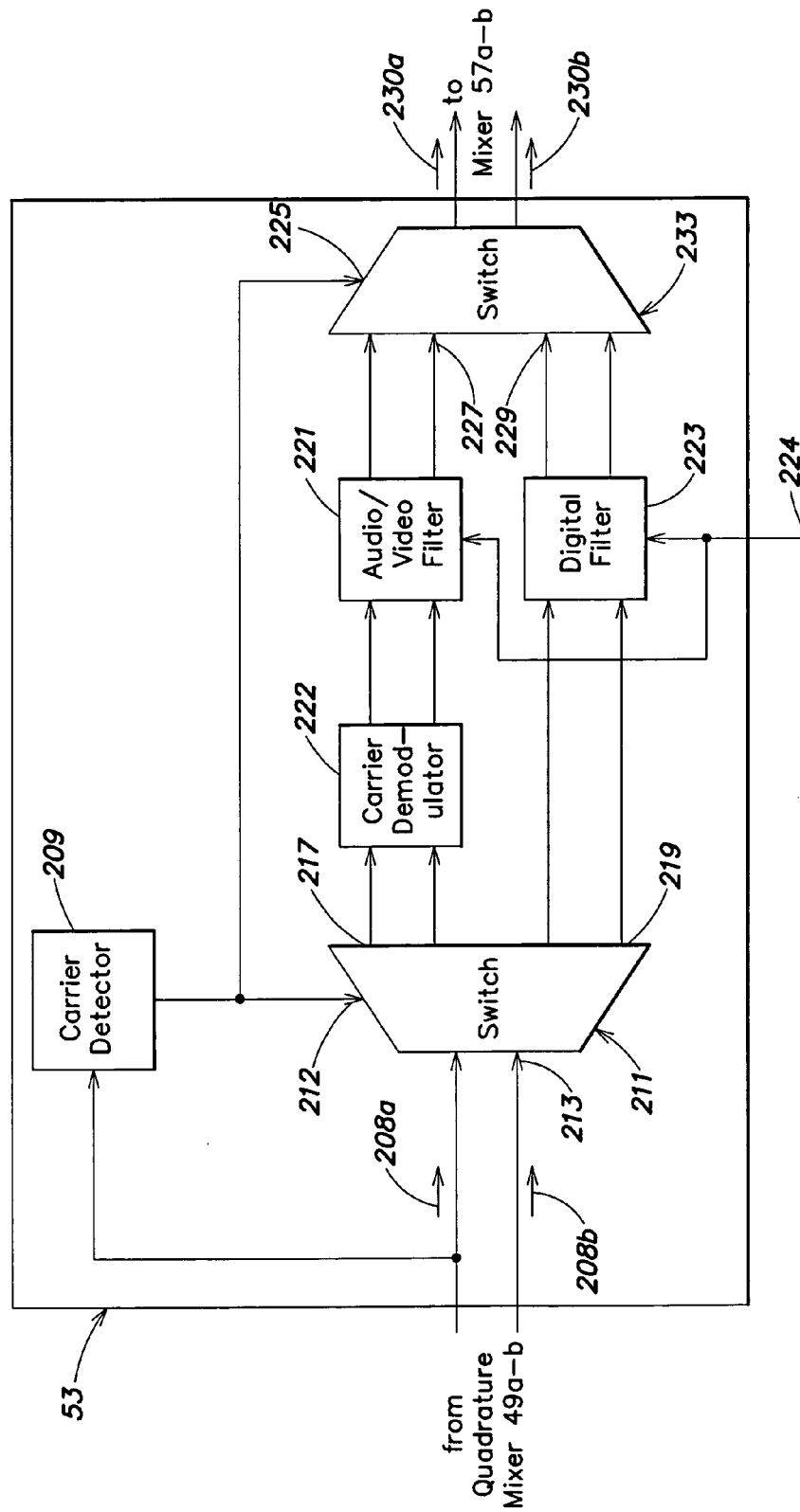
FIG. 5 is a schematic representation of an exemplary implementation of the filter 53 is shown in FIG. 4.

FIG. 5 illustrates an exemplary implementation of the filter 53 is shown in FIG. 4. Signals 208a–b from quadrature mixer 49a–b are input to the filter 53. One of signals 208a and 208b is input to a modulation detector 209 so that modulation detector 209 may detect whether the signal is analog modulated or digitally modulated. Signal 208a is shown as input to modulation detector 209 in FIG. 5, however signal 208b or both signals 208a and 208b may alternatively be input to modulation detector 209. Modulation detector 209 may, for example, comprise a carrier detector or a sync detector as described above, or may comprise both a carrier detector and a sync detector. Modulation detector 209 outputs a signal indicative of whether signal 208a is analog modulated to each of switches 211 and 233. This signal controls the state of each of the switches 211 and 233. In response to the signal received from modulation detector 209 at input 212, switch 211 selects one of the outputs 217 and 219 to be connected to the input 213 of the switch. If the signal received from modulation detector 209 indicates analog modulation of signals 208a, the switch 211 outputs the quadrature signals 208a–b at output 217. If the modulation detector 209 does not detect analog modulation of signal 208a, switch 211 outputs the signals at output 219. Thus, analog modulated signals are transmitted to carrier demodulator 222 and then to audio/video filter 221, while digitally modulated signals are transmitted to digital filter 223. Audio/video filter 221 receives and processes the demodulated signals transmitted from carrier demodulator 222. Audio/video filter 221 may be programmable via input 224, such that parameters of the filter may be changed based on a source (e.g., cable or terrestrial) and/or standard (e.g., NTSC, PAL, or SECAM) of television signal. For example, filter coefficients may be received via input 224. Digital filter 223 may be adapted to process digitally modulated signals and may be programmable via input 224 such that parameters of the filter may be changed based on a source and/or standard of television signal.

Inputs 227 and 229 of switch 233 are respectively coupled to audio/video filter 221 and digital filter 223. In response to the signal received from modulation detector 209 at input 225, switch 233 selects one of the inputs 227 and 229 to be connected to the output 231 of the switch. In particular, switch 233 may output signals received from audio/video filter 221 if modulation detector 209 detects analog modulation of signal 208a and may output signals received from digital filter 223 otherwise. Quadrature signals 230a–b output by the switch 233 are transmitted to mixers 57a–b.

Referring again to FIG. 4, mixers 57a–b and NCOs 59a–b, coupled thereto, may be optionally included as part of second die 13 to upconvert the output of the filter 53 to a particular frequency (e.g., 44 MHz) so that the tuner output is compatible with a particular standard having such a frequency requirement. The outputs of the mixers 57a–b are transmitted to digital tuner outputs 61a–b in the form of digital signals 21a–b, which may be an audio signal and a video signal or a real and imaginary signal. Alternatively, a single real signal or a single signal with both audio and video information may be used. The digital signals 21 a–b may be provided directly to a digital decoder, such as a digital decoder in a set-top box, without any need for analog-to-digital conversion. The outputs of the mixers 57a–b are also provided to digital-to-analog converters (DACs) 63a–b, respectively, so that analog signals 22a–b may be provided at analog tuner outputs 67a–b. The analog signals 22a–b, which are analog representations of digital signals 21a–b, may be provided to a digital decoder having analog inputs.

Having described an exemplary implementation of the tuner 9, the LNA 25, AGC 31, and IMF 29 of FIG. 3 will now be addressed in greater detail. As previously discussed, the LNA 25 may have a variable gain in accordance with one embodiment of the invention. One benefit of having a variable gain is that the gain may compensate for signals of varying power to achieve a substantially constant level at the output of the tuner. Compensating for signals of varying power may be particularly advantageous when the television signals received by the tuner may originate from both cable and terrestrial sources, as cable signals tend to have a much higher power than terrestrial signals.

Using a variable gain amplifier, a television signal from a cable source may be attenuated so that further processing by the tuner does not generate distortion in the television signal, and a television signal from a terrestrial source may be amplified so that noise resulting from further processing does not degrade the signal. In addition, using a variable gain amplifier to vary the gain of the television signal based on the composite power of the input signal may reduce the dynamic range requirements of the tuner processing circuitry. Thus, the dynamic range at the output of the LNA 25 may be smaller than the dynamic range at the input of the LNA 25. In one example, the dynamic range at the input of the LNA 25 is approximately equal to the difference between the maximum signal that can be processed by the tuner with acceptable distortion and the minimum signal that can be processed by the tuner with acceptable noise. At the output of the LNA 25, the dynamic range may be the difference between the input dynamic range and the gain range of the LNA 25.

An exemplary implementation of the LNA 25, AGC 31, and IMF 29 of FIG. 3 will now be described. According to one embodiment of the invention, LNA 25 is implemented using a plurality of amplifiers each having an architecture that is optimized for the receipt of particular signals. For example, two amplifiers may be used to process cable and terrestrial television signals. For example, one amplifier (e.g., a fixed gain amplifier) may be used to process weaker signals received and another amplifier (e.g., a variable gain amplifier) may be used to process stronger signals received. Weaker signals tend to be terrestrial signals, although this is not always necessarily the case. The impedance of each amplifier may be matched to the impedance of the television signal source (e.g., cable or antenna), and the gain of each amplifier may be selected based on the power of the signals it receives.

According to one embodiment of the invention, different impedance matching schemes are used for the receipt of stronger (e.g., cable) and weaker (e.g., terrestrial) signals. Although the impedance of both cable and antenna television signal sources is approximately the same, different considerations apply in selecting the elements for the impedance matching scheme of a cable and antenna. For example, it may be preferred that the impedance matching scheme of the antenna generate very little noise to lessen the degradation of the television signals received by the antenna, as terrestrial signals tend to be relatively weak. It may also be preferred that the impedance matching scheme of the cable be compatible with having a variable gain, as having a variable gain increases the dynamic gain range of the tuner so that signals having a large range of power levels may be received. Noise is less of a consideration with respect to cable signals because of the greater power of such signals. Thus, according to one implementation, the impedance matching scheme for weak input signals (e.g. signals received by an antenna) may use active elements (e.g. transistors), which generate less noise than non-active elements (e.g. resistors). The impedance matching scheme when the input signals are sufficiently large (e.g. signals received by a cable or strong signals received by an antenna) may use non-active elements, which are compatible for use in a variable gain amplifier. Active element-based matching is difficult to implement in a broadband television signal amplifier having a variable gain.

Figure 6:
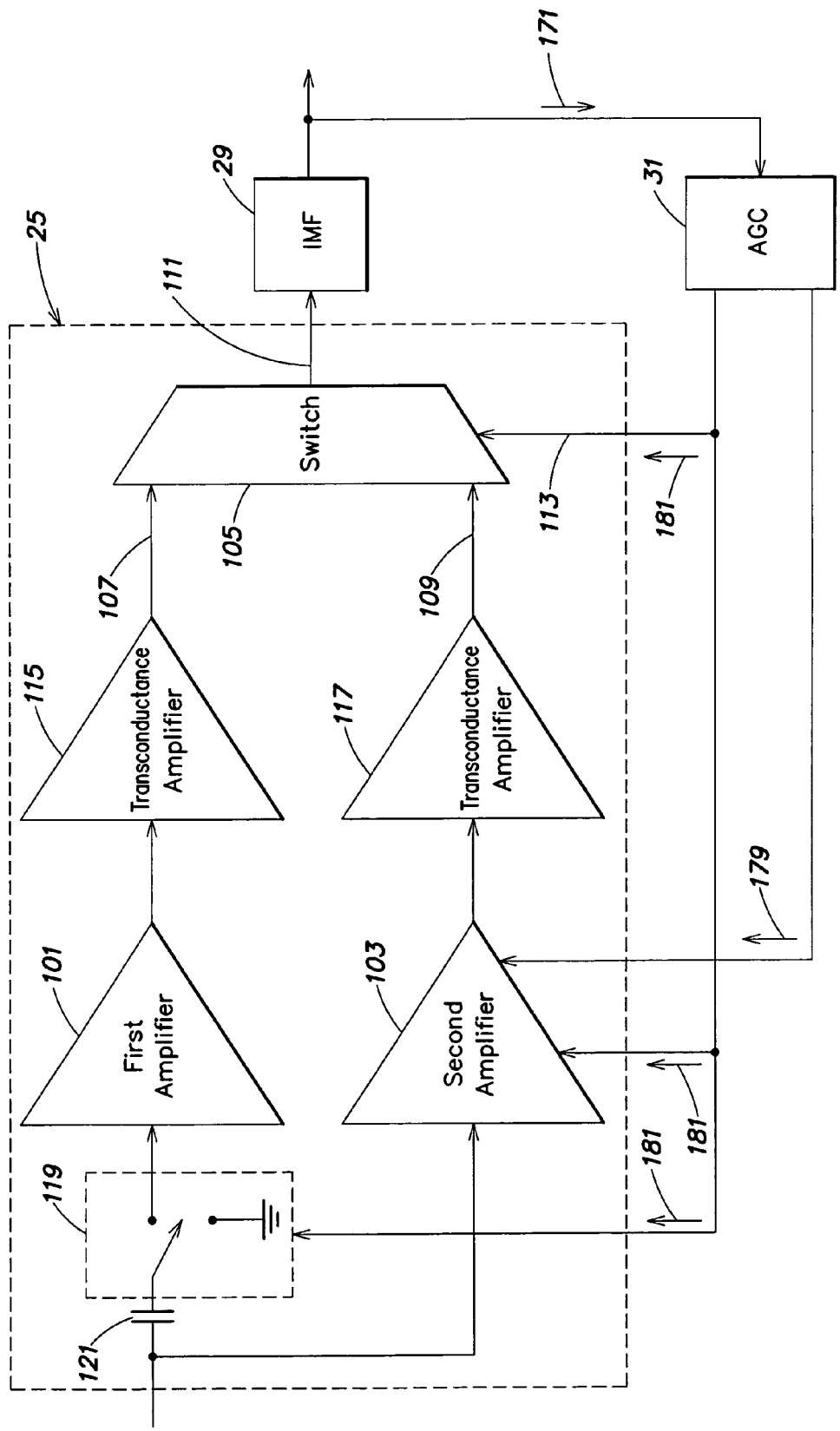
FIG. 6 is a schematic representation of an exemplary implementation of the LNA, IMF, and AGC shown in FIG. 4.

In the exemplary implementation of the LNA 25 shown in FIG. 6, LNA 25 comprises first and second amplifiers 101 and 103 coupled to a switch 105. The switch 105 functionally represents a mechanism that may be controlled to output a signal from one of the amplifiers 101 and 103. According to one embodiment of the invention, the first amplifier 101 is adapted for the receipt of weak terrestrial signals and the second amplifier 103 is adapted for the receipt of cable and strong terrestrial signals. In particular, the first amplifier 101 may have a fixed gain, and may use active elements to perform impedance matching. The second amplifier 103 may have a variable gain, and may be configured such that impedance matching is implemented without using active elements. For example, the second amplifier 103 may implement impedance matching using a resistive ladder.

Switch 105 comprises first and second inputs 107 and 109 and an output 111. The switch 105 further comprises a third input 113 for a switch control signal 181 to control the operation of the switch 105. The control signal 181, which may be generated by the AGC 31, controls the selection of the first and second inputs 107, 109 to be connected to the output 111. According to one embodiment of the invention, the first input 107 is coupled to the output 111 if the television signal received by the tuner has a power level below a given threshold, and the second input 109 is coupled to the output 111 if the television signal received by the tuner is has a power level above a given threshold. According to one exemplary implementation, the first input 107 is coupled to the output 111 if the power of the television signal received by the tuner is between approximately −85 dBm and −55 dBm, and the second input 109 is coupled to the output 111 if the power of the television signal received by the tuner is between approximately −55 dBm and +9 dBm. However, it should be appreciated that the invention is not limited in this respect. For example, control signal 181 may be generated in response to a manual switch that may be activated on the tuner, or in response to another stimulus. Terrestrial and cable television signals may be distinguished by power. Therefore, according to another exemplary implementation, the first input 107 is coupled to the output 111 if the television signal received by the tuner is a weak terrestrial television signal, and the second input 109 is coupled to the output 111 if the television signal received by the tuner is a cable or strong terrestrial television signal.

Preferably, the switch 105 is selected to allow for smooth switching between the first and second inputs 107, 109 so that discontinuities at the output 111 are lessened. According to one implementation, the switch 105 is a multiplexer. Discontinuities at output 111 may also be lessened by using currents at inputs 107 and 109 rather than voltages. To convert the voltage outputs of the amplifiers 101 and 103 to currents, transconductance amplifiers 115 and 117 may be coupled between the first and second amplifiers 101 and 103 and the first and second inputs 107 and 109, respectively.

It should be appreciated that although the switch 105 is described above as being a single switch distinct from each of the first and second amplifiers 101 and 103, the invention is not limited in this respect. For example, switch 105 may be implemented using a plurality of switches or other circuitry that enables multiplexing of signals. In addition, the one or more switches or circuitry that enables multiplexing may be integrated within the first and/or second amplifiers 101 and 103 themselves. Thus, it should be appreciated that switch 105 functionally represents a mechanism that enables switching between the first and second amplifiers 101 and 103, but that the actual implementation of the switch need not be as illustrated in FIG. 6.

Figures 7, 8:
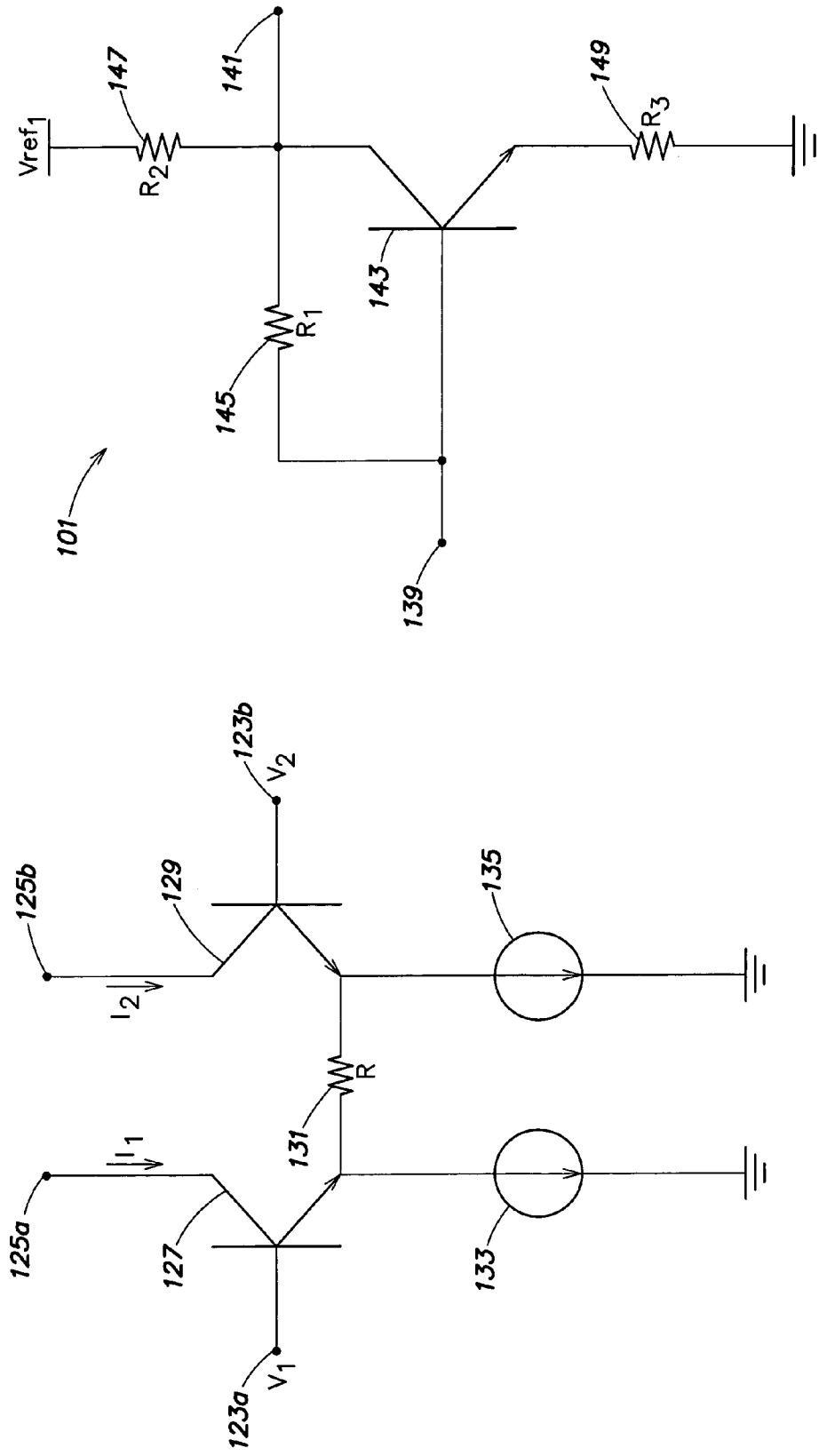
FIG. 7 is a circuit diagram of an exemplary implementation of a transconductance amplifier, such as the transconductance amplifiers shown in FIG. 6.
FIG. 8 is a circuit diagram of an exemplary implementation of the first amplifier shown in FIG. 6.

An exemplary implementation of a transconductance amplifier 137 such as the transconductance amplifiers 115, 117 of FIG. 6 is shown in FIG. 7. Transconductance amplifier 137 comprises an input nodes 123*a*–*b* and output nodes 125*a*–*b*. First and second transistors 127 and 129, which may be bipolar junction transistors, are respectively coupled at their bases to the input nodes 123*a* and 123*b*. The collectors of the first and second transistors 127 and 129 are respectively coupled to output nodes 125*a* and 125*b*, into which flow currents, $I_1$ and $I_2$. The emitters of the transistors 127, 129 are coupled by a resistor 131 having a resistance R. In addition, first and second current sources 133 and 135 are coupled between the emitters of the first and second transistors 127 and 129, respectively, and ground. It should be appreciated that while the transconductance amplifier 137 illustrated in FIG. 7 is shown as being implemented using bipolar devices, it is also possible to implement the transconductance amplifier using MOS devices.

The transconductance of the transconductance amplifier 137 may be expressed as follows, where $V_1$ is the voltage at the input node 123*a* and $V_2$ is the voltage at the input node 123*b*:

$$Gm = \frac{I_1 - I_2}{V_1 - V_2} = \frac{1}{R}$$

Turning again to FIG. 6, a switch 119 may be used to prevent the first amplifier from consuming power when switch 105 is not selected to output the signal from the first amplifier 101. The switch 119 may be located at the input of the first amplifier 101 and may be switchable to ground. The switch 119 may be controlled by the switch control signal 181 from AGC 31, which also controls the state of switch 105. It should be appreciated that although the switch 119 is illustrated as being a single switch distinct from each of the first and second amplifiers 101 and 103, the invention is not limited in this respect. For example, switch 119 may be implemented using a plurality of switches or other circuitry, and may be integrated within the first and/or second amplifiers 101 and 103 themselves. Capacitor 121 may be located at the input of the first amplifier 101, for example, for DC isolation of the first and second amplifiers 101, 103.

As discussed above, the first amplifier 101 may be adapted for the reception of low power signals, which may be terrestrial signals or even weak cable signals, for example. In particular, the first amplifier 101 may have a fixed gain, and may use active elements to perform impedance matching. In one example, the input impedance of the first amplifier 101 is approximately 75 Ω. The use of active elements (e.g., transistors) to match the impedance of the terrestrial receiver may beneficially reduce noise. According to one example, the first amplifier may have a noise figure of approximately 5 dB or less. The gain of the first amplifier 101 may be selected based on the power of the terrestrial signals. In one example, the gain of the first amplifier is approximately 18 dB.

One exemplary implementation of the first amplifier 101 having a fixed gain is shown in FIG. 8. The broadband television signal is input to the amplifier 101 at input node 139 and the amplified signal is output at output node 141. A transistor 143, which may be a bipolar junction transistor, is coupled between the input node 139 and the output node 141. Specifically, the base of transistor 143 is coupled to the input node 139, and the collector of transistor 143 is coupled to the output node 141. The first resistor 145 is coupled between the base and collector of transistor 143. A second resistor 147 is coupled between a reference voltage $V_{ref1}$ and the output node 141. A third resistor 149 is coupled between the emitter of transistor 143 and ground. It should be appreciated that although the first amplifier 101 of FIG. 8 is shown as having a single-ended configuration, the first amplifier 101 could alternatively be implemented differentially.

Where the transconductance (gm) of the transistor 143 is sufficiently high, the input impedance (Rin) of the first amplifier 101 may be described as follows, where the resistances of the first, second, and third resistors are $R_1$, $R_2$, and $R_3$, respectively:

$$R_{in} = \frac{R_1 + R_2}{1 + \frac{R_2}{R_3}}$$

The gain of the first amplifier 101 may be described as follows:

$$\text{Gain} = -\left[\frac{R_1 - R_3}{1 + \frac{R_3}{R_2}}\right] * \left[\frac{1}{R_{in}}\right]$$

In one exemplary implementation, $R_1$, $R_2$, and $R_3$ are selected such that the first amplifier 101 has an input impedance of 34.5 Ω and a gain of 18 dB. As discussed above, the second amplifier 103 may be adapted for the reception of higher power signals, which may be cable signals, for example. In particular, the second amplifier 103 may have a variable gain, and may use resistive elements to perform impedance matching. Resistive-based matching results in a higher noise figure than active element-based matching, but makes the variable gain implementation easier. The input impedance of the second amplifier 103 may be selected to match the impedance of a cable. The gain range of the second amplifier 103 may be selected based on the power of the cable signals. The gain range of the second amplifier 103 may have an upper value that is approximately the same as the gain of the first amplifier 101 to reduce the glitch when switching between the amplifiers. In one example, the gain of the second amplifier ranges from approximately −15 dB to approximately 18 dB. In another example, the gain range of the second amplifier is at least 18 dB. According to a further aspect of the invention, the gain of the second amplifier 103 may vary in response a gain control signal 179 generated by the AGC 31. The gain control signal 179 may be generated in response to an indication of the power (e.g., the RMS or peak power) of the television signals received or processed. For example, a television signal 171 from the output of the IMF 29 may be processed to determine the power of the signal. As will be discussed in connection with FIG. 9, the second amplifier 103 may also receive a switch control signal 181.

Figure 9:
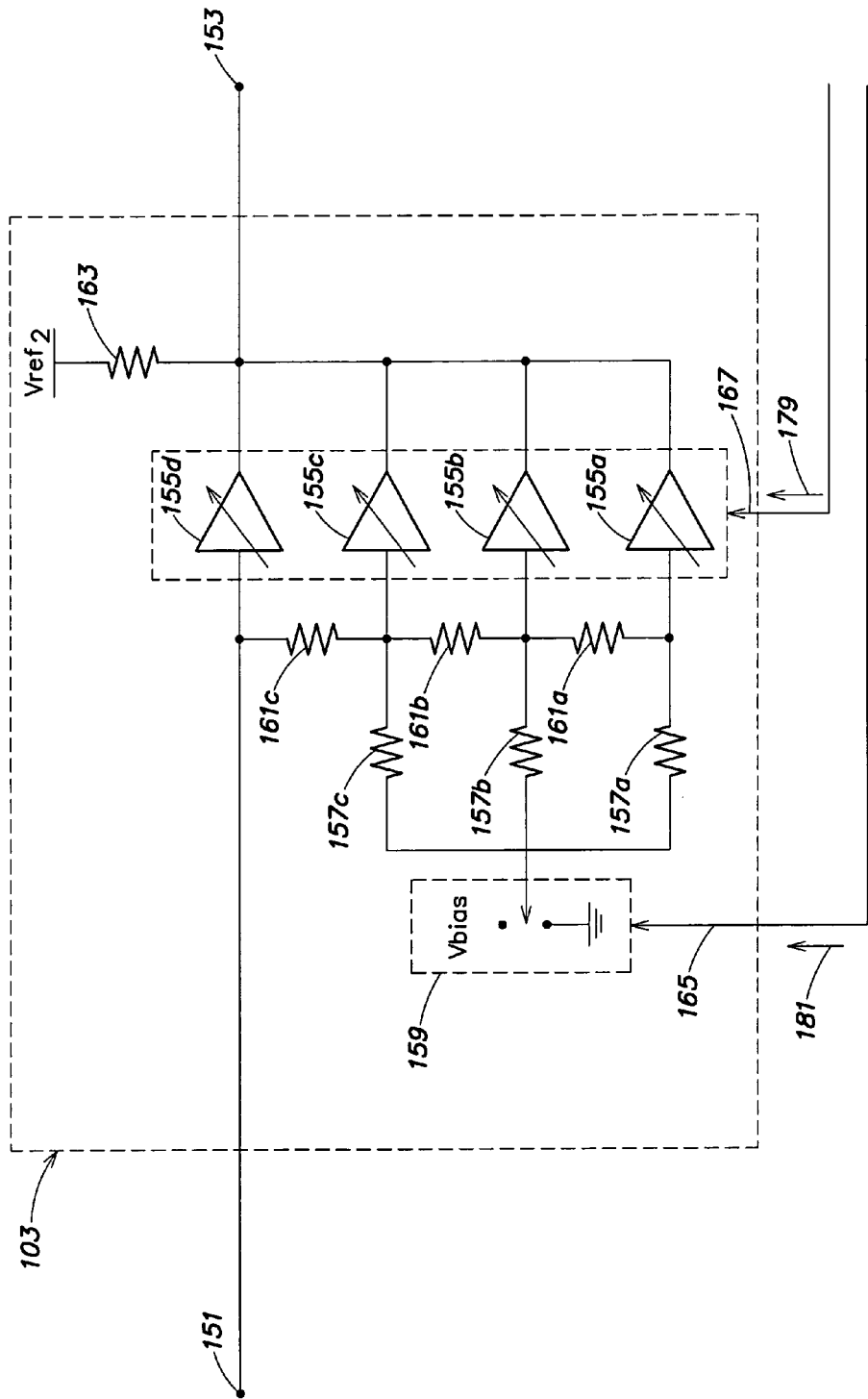
FIG. 9 is a circuit diagram of an exemplary implementation of the second amplifier shown in FIG. 6.

One example of an amplifier that may be suitable for use as second amplifier 103 is the variable gain amplifier described in commonly assigned U.S. Pat. No. 5,077,541 to Gilbert, which is incorporated herein by reference. Another exemplary implementation of the second amplifier 103, wherein the gain of the amplifier is variable, is shown in FIG. 9. A broadband television signal is input to the amplifier 103 at input node 151 and an amplified signal is output at output node 153. The second amplifier 103 includes first, second, third, and fourth transconductance amplifiers 155a–d, which may have transconductances that are independently variable. The output of each of the transconductance amplifiers 155a–d is connected to the output node 153 of the second amplifier 103. First, second, and third resistors 157a–c are coupled between the inputs of the first, second, and third transconductance amplifiers 155a–c, respectively, and a switch 159. The switch is selectable between a bias voltage Vbias and ground. The switch 159 may be controlled by a control signal from AGC 31 (FIG. 6) that controls the state of the switch 105 (FIG. 6), such that the switch 159 is connected to bias voltage Vbias when the switch 105 (FIG. 6) is selected to output the signal from the second amplifier 103 and connected to ground when it is not. Fourth, fifth, and sixth resistors 161a–c are respectively coupled between the inputs of the first and second transconductance amplifiers 155a–b, the second and third transconductance amplifiers 155b–c, and the third and fourth transconductance amplifiers 155c–d. A seventh resistor 163 is coupled between the output node 153 of the second amplifier 103 and a reference voltage $V_{ref2}$.

The voltage Vo at the output node of the second amplifier 103 may be expressed by the following equation, where $Gm_1$–$Gm_4$ are the transconductance values for the first through fourth transconductance amplifiers 155a–d, Vin is the voltage at input node 151, and $R_{163}$ is the resistance of resistor 163:

$$V_o = \left[[V_{in} * Gm_4] + \left[\frac{V_{in}}{2} * Gm_3\right] + \left[\frac{V_{in}}{4} * Gm_2\right] + \left[\frac{V_{in}}{8} * Gm_1\right]\right] R_{163}$$

Input 167 may be used to control the transconductance values $Gm_1$–$Gm_4$. According to one example shown in FIG. 6, AGC 31 may supply a gain control signal 179 to the second amplifier 103 based on a desired gain of the second amplifier 103. The AGC 31 may select the desired gain based on a detected power of a television signal 171 at the output of the IMF 29. Gain control signal 179 may be provided to the transconductance amplifiers 155a–d via the input 167 of the second amplifier 103.

According to one exemplary implementation, each of transconductance amplifiers 155a–d may be implemented as shown in FIG. 7, but where resistor 131 is provided with a variable resistance. Varying the resistance of the resistor 131 changes the transconductance of the amplifier.

Figure 10:
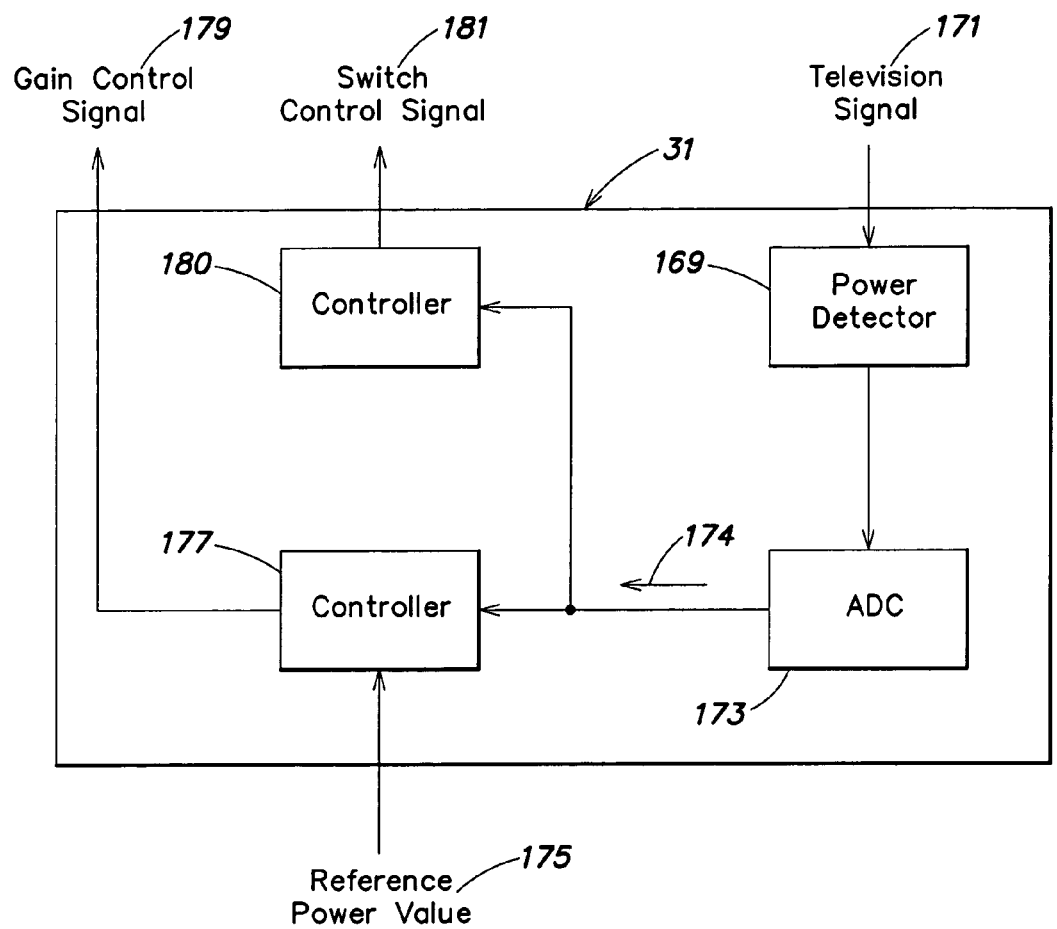
FIG. 10 is a schematic representation of an exemplary implementation of the AGC shown in FIG. 6.

An exemplary implementation of the AGC 31 of FIG. 6 is illustrated in FIG. 10. The AGC 31 receives a television signal 171, which may be received from the output of the IMF 29 as shown in FIG. 6. The television signal may alternatively be received from another source, such as the input of the tuner. A power detector 169 measures the power of television signal 171. In one implementation, the power detector includes an envelope detector to generate the average envelope of the broadband signal from which an average power of the signal can be determined. An analog-to-digital converter (ADC) 173 then digitizes the output of the power detector 169 and outputs signal 174. The output of the ADC 173 and a reference power value 175 are input to a controller 177. The reference power value 175 may represent the desired peak or RMS power of the television signal at the output of the IMF 29 (FIG. 6). According to one example, the controller 177 may be a proportional derivative (PD) controller. Controller 177 generates a gain control signal 179 based on the output of the ADC 173, signal 174, and the reference power value 175. The gain control signal 179 is supplied to the second amplifier 103 via input 167 and used to program the transconductance of each of the transconductance amplifiers 155a–d. Each of the transconductance amplifiers 155a–d may separately receive a different input (i.e., some number of bits) derived from the output of the controller 177.

Another controller, controller 180, may generate a switch control signal 181 to control activation of switch 105, as shown in FIG. 6. In addition, the switch control signal 181 may be sent to each of first and second amplifiers 101 and 103, shown in FIG. 6, and may be used to disable the amplifier that is not connected to output 111 by switch 105. As discussed previously, switch control signal 181 may be based on the detected power of a broadband television signal (e.g., television signal 171), in connection with an embodiment of the invention. According to one implementation illustrated in FIG. 10, controller 180 may be used to generate switch control signal 181 in response to a detected power of television signal 171.

Figure 11:
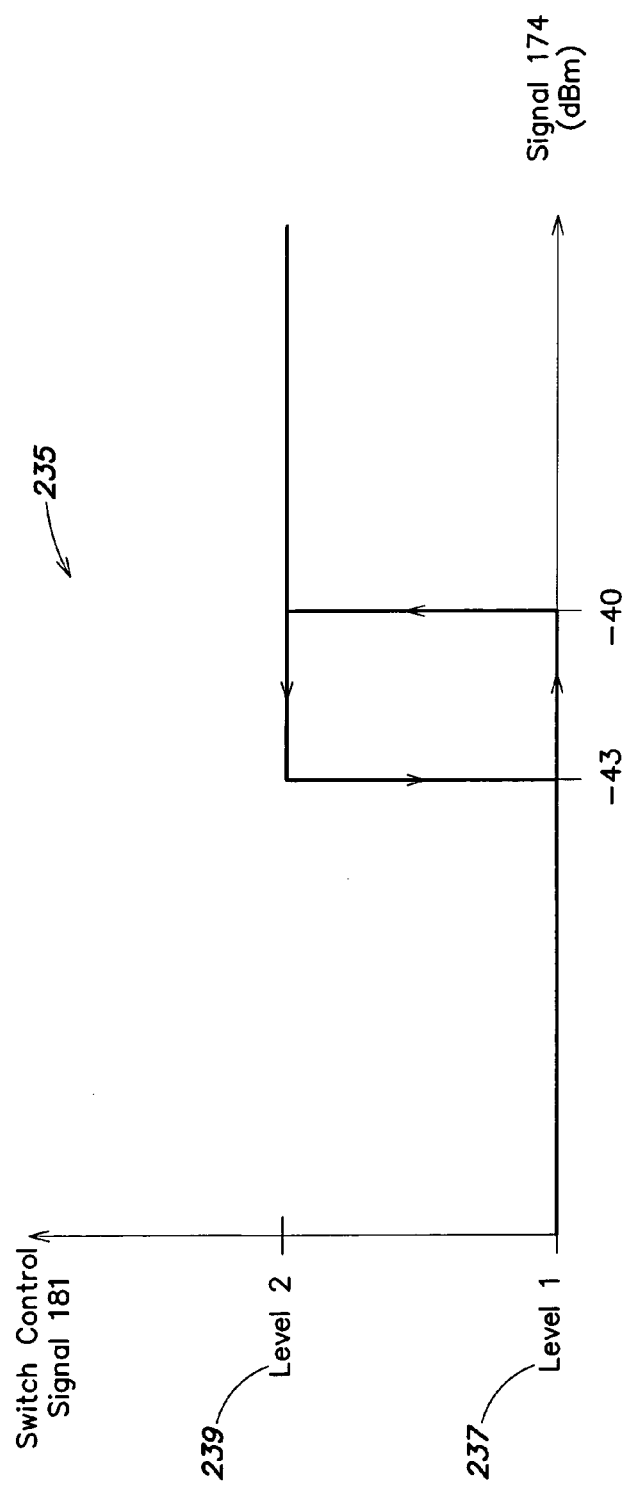
FIG. 11 is one example of a function that may be implemented by the hysteresis controller shown in FIG. 10.

Controller 180 receives signal 174, which is a digital signal representing the power of television signal 171, and outputs switch control signal 181. The switch control signal 181 may be generated by the controller 180 based on hysteresis curve 235, such as that shown in FIG. 11. Hysteresis curve 235 illustrates the switch control signal 181 as a function of signal 174. The hysteresis curve 235 comprises two thresholds, one at −43 dBm and one at −40 dBm. When signal 174 is increasing, switch control signal 181 increases from a first level 237 to a second level 239 when signal 174 increases past −40 dBm. When signal 174 is decreasing, switch control signal 181 decreases from the second level 239 to the first level 237 when signal 174 decreases past −43 dBm. When switch control signal 181 is at the first level 237, amplifier 101 is activated and amplifier 103 is unactivated. When switch control signal 181 is at the second level 239, amplifier 103 is activated and amplifier 101 is unactivated. The use of different thresholds for switching amplifiers depending on whether power is increasing or decreasing may reduce oscillation. It should be appreciated that the hysteresis curve 235 shown in FIG. 11 is merely exemplary, and that other thresholds or functions for controlling switch control signal 181 may be used.

Figure 12:
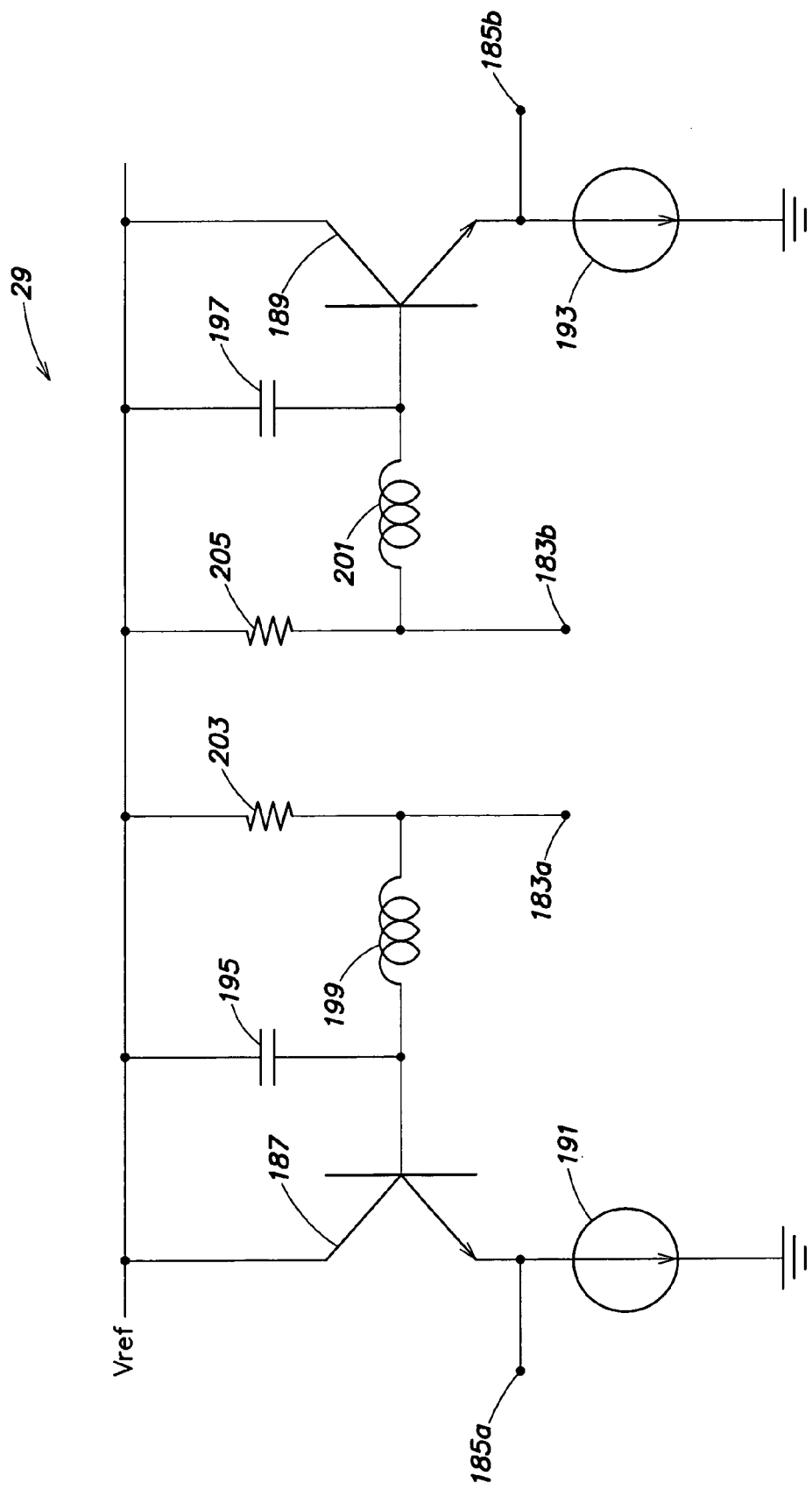
FIG. 12 is a circuit diagram of an exemplary implementation of the IMF shown in FIG. 6.

An exemplary implementation of the image filter (IMF) 29 of FIG. 6 is shown in FIG. 12. The IMF 29 includes input nodes 183a–b and output nodes 185a–b. The output nodes 185a and 185b are respectively coupled between the emitters of first and second transistors 187 and 189 and one end of the first and second current sources 191 and 193. The other end of each of the first and second current sources 191 and 193 is coupled to ground. The bases of transistors 187 and 189 are respectively coupled to one end of capacitors 195 and 197 and inductors 199 and 201. The other end of each of capacitors 195 and 197 is coupled to a reference voltage $V_{ref}$. The other ends of inductors 199 and 201 are respectively coupled to resistors 203 and 205 at input nodes 183a and 183b. An end of each resistors 203 and 205 is also coupled to the reference voltage $V_{ref}$, as is the collector of each of transistors 187 and 189. It should be appreciated that while the IMF 29 illustrated in FIG. 12 is shown as being implemented using bipolar devices, it is also possible to implement the IMF using MOS devices.

The quality factor (Q) of the IMF 29 may be expressed by the following equation:

$$Q = \frac{1}{R}\sqrt{\frac{L}{C}}$$

where R represents the resistance of resistors 203 and 205, L represents the inductance of the inductors 199 and 201, and C represents the capacitance of capacitors 195 and 197. Similarly, the natural frequency ($\Omega_0$) of the IMF 29 may be expressed by the following equation:

$$\Omega_o = \frac{1}{\sqrt{LC}}$$

where L represents the inductance of the inductors 199 and 201 and C represents the capacitance of capacitors 195 and 197.

Having described several illustrative embodiments of the invention, various alterations, modifications and improvements will readily occur to those skilled in the art. Such alterations, modifications and improvements are intended to be in the spirit and scope of the invention. Accordingly, the foregoing description is by way of example only and is not intended as limiting. The invention is limited only as defined in the following claims and the equivalents thereto.

What is claimed is:

1. A tuner amplifier system, comprising:
   a tuner amplifier input that receives a tuner amplifier input signal;
   a first amplifier comprising an input and an output, the input of the first amplifier being coupled to the tuner amplifier input;
   a second amplifier comprising an input and an output, the input of the second amplifier being coupled to the tuner amplifier input, wherein the second amplifier is a variable gain amplifier;
   a tuner amplifier output that transmits a tuner amplifier output signal; and
   at least one switch adapted to select a pathway from which the tuner amplifier output signal is received, wherein the pathway comprises one of the first amplifier and the second amplifier.

2. The tuner amplifier system of claim 1, wherein the at least one switch comprises a first input coupled to the output of the first amplifier, a second input coupled to the output of the second amplifier, and an output, wherein the switch is adapted to couple one of the first and second inputs of the switch to the output of the switch.

3. The tuner amplifier system of claim 1, wherein the at least one switch comprises a plurality of switches.

4. The tuner amplifier system of claim 1, wherein the at least one switch is incorporated within at least one of the first and second amplifiers.

5. The tuner amplifier system of claim 1, wherein the at least one switch is further adapted to select the pathway from which the tuner amplifier output signal is received in response to a detected power.

6. The tuner amplifier system of claim 5, wherein the second amplifier further comprises at least one transconductance amplifier having a transconductance that is responsive to an indication of the detected power.

7. The tuner amplifier system of claim 6, wherein a transconductance of each of the at least one transconductance amplifier has a transconductance that is independently variable.

8. The tuner amplifier system of claim 5, wherein the at least one switch is further adapted to select the pathway from which the tuner amplifier output signal is received in response to a detected power of a signal at the output of the tuner amplifier.

9. The tuner amplifier system of claim 8, wherein the signal at the output of the tuner amplifier is a broadband signal.

10. The tuner amplifier system of claim 8, wherein the at least one switch is adapted to select the pathway as a pathway comprising the first amplifier in response to detecting a power level that is less than a first value and select the pathway as a pathway comprising the second amplifier in response to detecting a power level that is greater than a second value, wherein the first value is larger than the second value.

11. The tuner amplifier system of claim 8, wherein the at least one switch is adapted to select the pathway from which the tuner amplifier output signal is received in response to a hysteresis function.

12. The tuner amplifier system of claim 1, wherein the at least one switch is further adapted to select the pathway as a pathway comprising the first amplifier when a power of the tuner amplifier input signal is within a first range and select the pathway as a pathway comprising the second amplifier when the power of the tuner amplifier input signal is within a second range.

13. The tuner amplifier system of claim 12, wherein the at least one switch is adapted to select the pathway as a pathway comprising the first amplifier when the power of the tuner amplifier input signal is between approximately −85 dBm and a selected value.

14. The tuner amplifier system of claim 12, wherein the at least one switch is adapted to select the pathway as a pathway comprising the second amplifier when the power of the tuner amplifier input signal is between the selected value and approximately +9 dBm.

15. The tuner amplifier system of claim 1, wherein the first amplifier is a fixed gain amplifier and the second amplifier is a variable gain amplifier.

16. The tuner amplifier system of claim 15, wherein an impedance network of the first amplifier comprises active elements.

17. The tuner amplifier system of claim 15, wherein a noise figure of the first amplifier is equal to or less than approximately 5 dB.

18. The tuner amplifier system of claim 15, wherein an impedance network of the second amplifier includes substantially no active elements.

19. The tuner amplifier system of claim 15, wherein a gain of the first amplifier is approximately equal to a maximum gain of the second amplifier.

20. The tuner amplifier system of claim 15, further comprising:
   a power detector coupled to the output of the tuner amplifier; and
   a gain controller coupled to the second amplifier to control the gain of the second amplifier in response to an indication of power generated by the power detector.

21. The tuner amplifier system of claim 20, wherein the power detector generates an indication of peak power.

22. The tuner amplifier system of claim 20, wherein the power detector generates an indication of RMS power.

23. The tuner amplifier system of claim 20, wherein the at least one switch is adapted to select the pathway as a pathway comprising the first amplifier in response to the indication of power being less than a first value and select the pathway as a pathway comprising the second amplifier in response to the indication of power being greater than a second value, wherein the first value is greater than the second value.

24. The tuner amplifier system of claim 20, further comprising:
   an image filter coupled between the output of the tuner amplifier and the power detector.

25. The tuner amplifier system of claim 1, wherein the tuner amplifier input receives a television signal.

26. The tuner amplifier system of claim 1, wherein the first amplifier comprises a differential input and a differential output.

27. The tuner amplifier system of claim 1, wherein the second amplifier comprises a differential input and a differential output.

* * * * *